Figure 1:
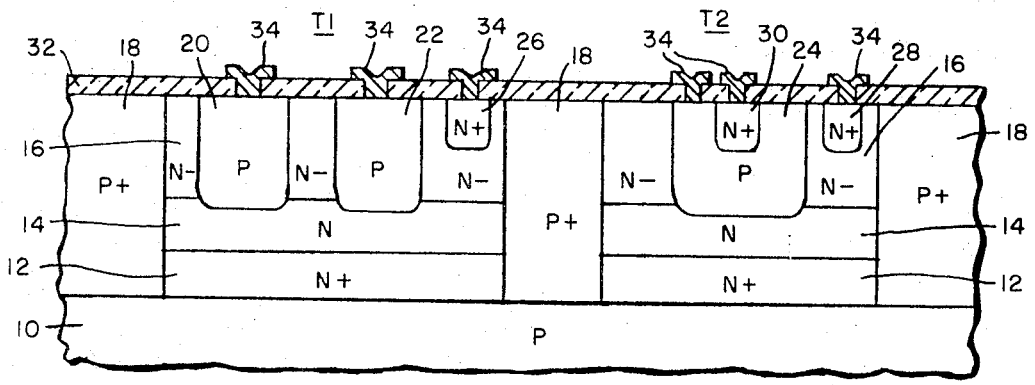
Figure 2:
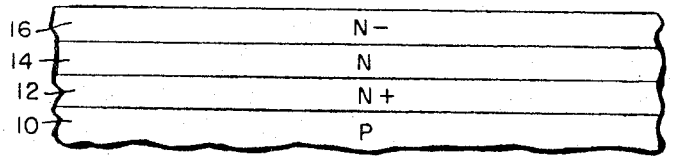
Figure 3:
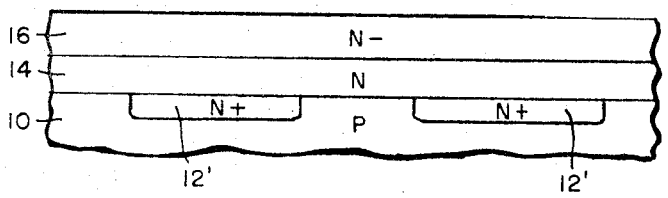
Figure 4:
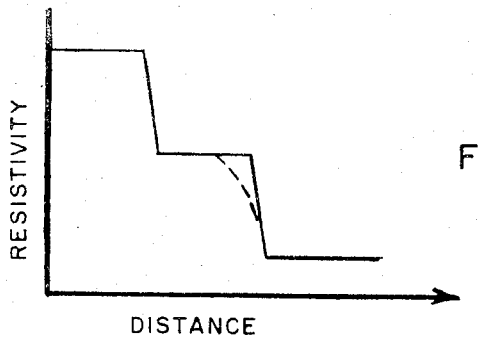

T861057

DEFENSIVE PUBLICATION

UNITED STATES PATENT OFFICE

Published at the request of the applicant or owner in accordance with the Notice of Apr. 11, 1968, 849 O.G. 1221. Identification is by serial number of the application and the heading indicates the number of pages of specification, including claims, and of sheets of drawing contained in the application as originally filed. The file of this application is available to the public for inspection; reproduction may be purchased for 30 cents per sheet.

Applications published under the Defensive Publication Program have not been examined as to the merits of alleged invention. The Patent Office makes no assertion as to the novelty of the disclosed subject matter.

PUBLISHED APRIL 29, 1969

861 O.G. 1357

769,261
SEMICONDUCTOR INTEGRATED CIRCUIT
Hung Chang Lin, 8 Schindler Court,
Silver Spring, Md. 20903
Filed Oct. 21, 1968. Published Apr. 29, 1969
Int. Cl. H01l *11/00, 15/00*
U.S. Cl. 317—235
1 Sheet Drawing. 11 Pages Specification

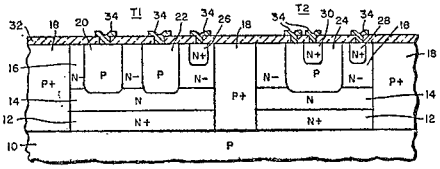

Three successive layers of semiconductive material of the same conductivity type with decreasing steps in resistivity are used in a new basic structure for the formation of integrated circuits including bipolar transistors whether of vertical or lateral configuration. The abruptly higher resistivity of the top layer provides higher current gain for lateral transistors and minimizes useless vertical injection. In both types of transistors the junction breakdown voltages are improved and inversion layers giving rise to undesired channel leakage currents are avoided.

April 29, 1969 HUNG CHANG LIN DEF. PUB. T861057

SEMICONDUCTOR INTEGRATED CIRCUIT SN-769261

Filed Oct. 21, 1968

INVENTOR
Hung Chang Lin.
BY
Gordon W. Walter
ATTORNEY